United States Patent [19]

Konishi

[11] Patent Number: 4,567,446
[45] Date of Patent: Jan. 28, 1986

[54] LIGHT-RECEIVING DEVICE FOR OPTICAL DATA TRANSFER SYSTEM

[75] Inventor: Kuniyoshi Konishi, Tokyo, Japan

[73] Assignee: Tokyo Shibaura Denki Kabushiki Kaisha, Kawasaki, Japan

[21] Appl. No.: 535,629

[22] Filed: Sep. 26, 1983

[30] Foreign Application Priority Data

Sep. 29, 1982 [JP] Japan ................. 57-170354

[51] Int. Cl.$^4$ ............................................. H03F 17/00
[52] U.S. Cl. ................................ 330/308; 250/214 A
[58] Field of Search ............. 330/59, 145, 284, 308; 250/214 A

[56] References Cited

U.S. PATENT DOCUMENTS 4,019,160  4/1977  Kam ............................... 330/145 X

OTHER PUBLICATIONS

Tarasyuk et al., "Increasing the Operational Reliability of the Automation Unit for the LG-32 Laser", *Instrum. & Exp. Tech.*, vol. 22, No. 4, Jul.-Aug. 1979, pp. 1136-1138.

*Primary Examiner*—James B. Mullins
*Attorney, Agent, or Firm*—Cushman, Darby & Cushman

[57] ABSTRACT

A light-receiving device including a photo-detector, for issuing a current signal corresponding to a received light signal, preamplifier, variable attenuating circuit and main amplifier. The preamplifier acts as a current amplifier for amplifying an output current signal from the photo-detector. The variable attenuating circuit acts as a current attenuating circuit for attenuating an output current signal from the preamplifier. The main amplifier amplifies an output current from the variable attenuating circuit and issues an amplified voltage.

4 Claims, 8 Drawing Figures

LIGHT-RECEIVING DEVICE FOR OPTICAL DATA TRANSFER SYSTEM

BACKGROUND OF THE INVENTION

This invention relates to a light-receiving device which converts the received light signal to a voltage signal.

In recent years, a great demand has existed for light-receiving devices due to the development of optical communications. FIG. 1 shows the circuit arrangement of the prior art light-receiving devices. This devices comprises a photo-detector 10, preamplifier 12, variable attenuating circuit 14, and main amplifier 16. Coupling capacitors 18, 20, 22 are connected between the respective series-connected elements 10, 12; 12, 14; 14, 16. The photo-detector 10 comprises a photodiode 24 and a resistor 26 connected in series between a power source V and a ground. The photodiode 24 is set near one end of an optical fiber 30 acting as a light transmitting line. A light signal entering the photodiode 24 is converted to a current signal by the photo-detector 10. The current signal from the photo-detector 10 is supplied to the preamplifier 12 through the coupling capacitor 18. The preamplifier 12 comprises the series connection of transistors 32, 34. This preamplifier 12 amplifies a base current signal input to the base and sends forth an amplified voltage signal. The voltage signal from the preamplifier 12 is supplied to a variable attenuating circuit 14 through the coupling capacitor 20. The variable attenuating circuit 14 is a T-type attenuating circuit formed of PIN diodes 36, 38, 40. The PIN diodes 36, 38 are connected in series. A capacitor 42 is connected between the node of the PIN diodes 36, 38 and the cathode of the PIN diode 40. The variable attenuating circuit 14 varies the ratio that an input voltage is divided by changing the resistance components of the PIN diodes 36, 38, 40, thereby changing the attenuation level of an input voltage. Constant current sources 44, 46, 48 for controlling the variable attenuating circuit 14 are respectively connected to the PIN diodes 36, 38, 40. An output voltage signal from the variable attenuating circuit 14 is supplied to the main amplifier 16 through the coupling capacitor 22. The main amplifier 16, which includes a transistor 50, sends forth an input voltage in an amplified state. An output voltage signal from the main amplifier 16 is supplied to an external device as a voltage signal corresponding to the light entering the photodiode 24.

FIG. 2A shows an equivalent circuit of the variable attenuating circuit 14 of FIG. 1. Reference character V1 shows a power source for the preamplifier 12, and reference character R1 denotes an output impedance of the preamplifier 12. The output impedance R1 of the preamplifier 12 which sends forth a voltage output substantially indicates 0 $\Omega$. Variable resistances R2, R3, R4 respectively indicate the resistance components of the PIN diodes 36, 38, 40. Reference character R5 represents an input impedance of the main amplifier 16. Reference characters C1, C2, C3 denote floating capacitances.

It is now assumed that R2=R3 and R2 (=R3)<<R4. The equivalent circuit of FIG. 2A is changed to that of FIG. 2B. If the resistances R2, R3 are both 0 $\Omega$, the time constant $\tau$ is measured as follows, since the resistance R1 is much lower than the resistances R4, R5.

$$\tau = R1(C1+C2+C3) \tag{1}$$

Since the resistance R1 substantially indicates 0 $\Omega$, the frequency response is only slightly deteriorated by the floating capacitances C1, C2, C3.

Assuming, however, R2 (=R3)>>R4, an equivalent circuit represents the circuit of FIG. 2C. If the resistance R1 and floating capacitance C1 are disregarded, the time constant $\tau$ is determined as follows:

$$\tau = \frac{R3 \times R5}{R3 + R5} \times C3 \tag{2}$$

The term $$\frac{R3 \times R5}{R3 + R5}$$

denotes a resistance of hundreds of $\Omega$s to kilos of $\Omega$s. Therefore, the floating capacitance C3 substantially affects the frequency response. If $$\frac{R3 \times R5}{R3 + R5} = 1 \text{ k}\Omega \text{ and } C3 = 10 \text{ pF},$$

a cutoff frequency $$fc = \frac{1}{2\pi\tau} \approx 15.9 \text{ MHz}.$$

As described above, the conventional light-receiving device has the following drawbacks: (1) the floating capacitance reduces the frequency response, thereby resulting in the deterioration of the waveform of a high frequency signal, causing unreliability in the light-receiving device; and (2) since an output current signal from a photo-detector is converted to a voltage signal by a preamplifier, and the voltage signal is further amplified by the main amplifier, a circuitry involving the preamplifier and other elements is considerably complicated.

SUMMARY OF THE INVENTION

It is accordingly the object of this invention to provide a light-receiving device which prevents a frequency response from being deteriorated by a stray capacitance and also prevents the waveform of an electric signal converted from a received light signal from deteriorating, and which can be manufactured with fewer parts than required in the prior art.

To attain the above-mentioned object, this invention provides a light-receiving device which comprises a photo-detector which converts a received light signal to a current signal, a preamplifier which amplifies a current signal produced from the photo-detector, a variable attenuating circuit which has a variable resistance and which attenuates a current signal produced from the preamplifier in accordance with a varied resistance and sends forth a current signal thus attenuated, and a main amplifier which amplifies a current signal produced from the variable attenuating circuit and sends forth a voltage signal.

DETAILED DESCRIPTION OF THE PREFERRED EMBODIMENT

Figure 3:
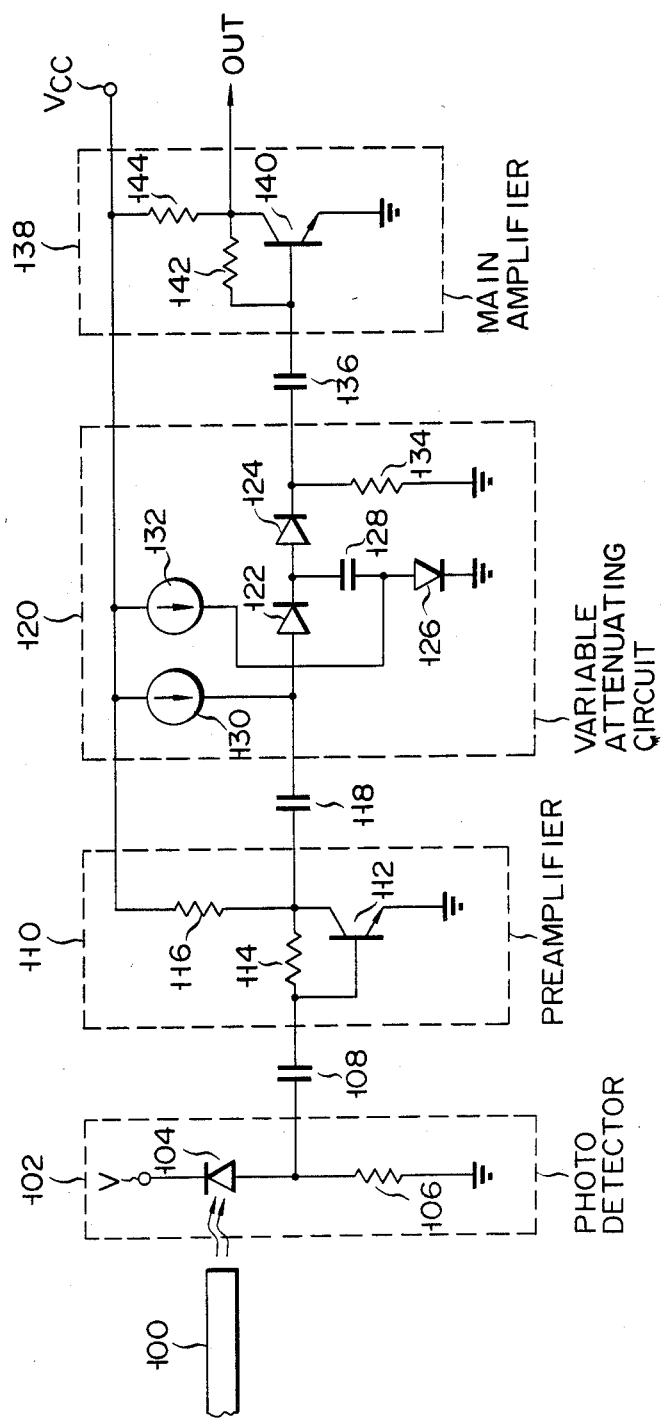
FIG. 3 is a circuit diagram of a light-receiving device embodying this invention.

A light-receiving device according to this invention will now be described with reference to the accompanying drawings. FIG. 3 is a circuit diagram of the light-receiving device of one embodiment. A light signal transmitted through a light passage (for example, an optical fiber) 100 is received by a photo-detector 102. This photo-detector 102 includes a photo-detecting element (for example, a photodiode) 104 and a resistor 106 which are connected in series between a power source V and ground. A light signal is converted to a current signal by the photodiode 104 in the photo-detector 102. The current signal is produced from a node located between the photodiode 104 and resistor 106. A current signal produced from the photo-detector 102 is supplied to a preamplifier 110 through a coupling capacitor 108. This preamplifier 110 comprises a current amplifier including an emitter-grounded transistor 112 and resistors 114, 116. The resistor 114 is connected between the base and collector of the transistor 112, and the resistor 116 is connected between the collector of the transistor 112 and power source Vcc. A current signal supplied to the base of the transistor 112 is amplified by the preamplifier 110 and the amplified signal is supplied from the collector of the transistor 112 to a variable attenuating circuit 120 through a coupling capacitor 118. The variable attenuating circuit 120 comprises a T-type attenuator including PIN diodes 122, 124, 126. The PIN diodes 122, 124 are connected in series. One end (anode) of the PIN diode 126 is connected to a node between the PIN diodes 122, 124 through a capacitor 128. The other end (cathode) of the PIN diode 126 is grounded. Constant current sources 130, 132 for controlling the variable attenuating circuit 120 are respectively connected to the PIN diodes 122, 126. The PIN diode 124 is connected to a resistor 134. The ratio in which an input current is supplied to the respective diodes is changed by varying the resistance components of the PIN diodes 122, 124, 126, thereby changing the attenuation level of an input current. A current signal produced from the cathode of the PIN diode 124 in the variable attenuating circuit 120 is supplied to a main amplifier 138 through a coupling capacitor 136. This main amplifier 138 is a current input type, and includes an emitter-grounded transistor 140 as does the preamplifier 110. A resistor 142 is connected between the base and collector of the transistor 140, and a resistor 144 is connected between the collector of the transistor 140 and power source Vcc. The transistor 140 amplifies a current signal supplied to its base and produces a collector voltage signal from its collector. The main amplifier 138 produces a voltage signal corresponding to the light signal received by the photodiode 104. This output voltage signal is delivered to an external device (not shown).

Figure 4A:
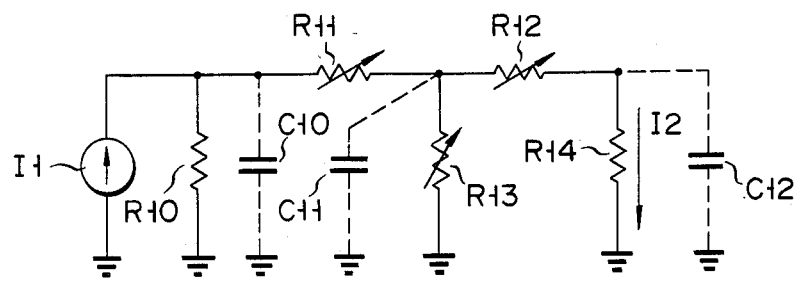
FIGS. 4A, 4B and 4C indicate the equivalent circuits of a variable attenuating circuit of FIG. 3.

FIG. 4A is an equivalent circuit diagram primarily showing the variable attenuating circuit 120 of the light-receiving device shown in FIG. 3. Since the preamplifier 110 is a current input type, an output impedance R10 of the preamplifier 110 is connected in parallel to a current source I1 of the preamplifier 110. Resistance components of the PIN diodes 122, 124, 126 connected in the form of a T in the variable attenuating circuit 120 are represented by variable resistances R11, R12, R13. An input impedance R14 of the main amplifier 138 is connected in parallel to the current source I1. Since the main amplifier 138 is also a current input type, the input impedance R14 substantially indicates 0 $\Omega$. Floating capacitances C10, C11, C12 are respectively connected in parallel to the resistances R10, R13, R14.

Figure 4B:
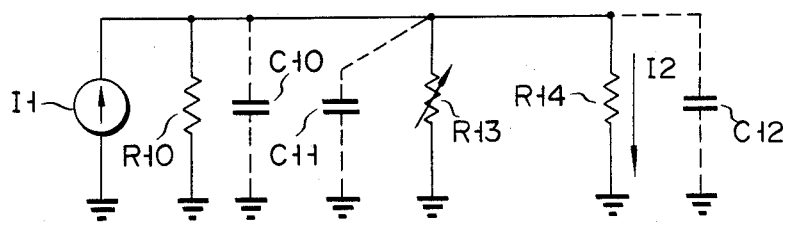

How the floating capacitances C10, C11, C12 affect the frequency response of the variable attenuating circuit 120 according to this embodiment will now be described. In this case, R11=R12 is assumed for ease of description. The case where R11 (=R12) is larger than R13 and the case where R11 (=R12) is smaller than R13 will be described. First, the case of R11 (=R12)<<R13 will be described. In this case, the equivalent circuit of the variable attenuating circuit 120 is indicated by FIG. 4B assuming R11=R12$\approx$0 $\Omega$. Since the resistance R14 is far smaller than the resistances R10, R13, the time constant $\tau$ of the variable attenuating circuit 120 is determined as follows:

$$\tau = R14(C10 + C11 + C12) \tag{3}$$

Figure 4C:
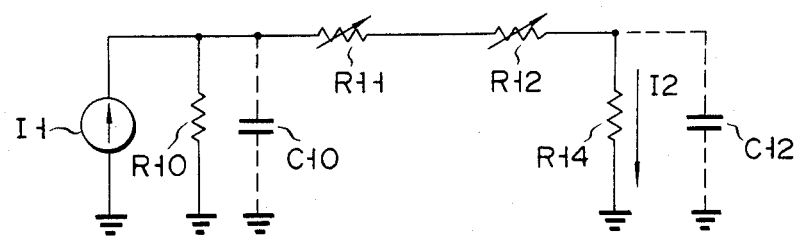

Since resistance R14 substantially remains at 0 $\Omega$ as previously mentioned, the frequency response is only slightly deteriorated by a floating capacitance. R11 (=R12)<<R13 denotes I2/I1=1, which occurs where attenuation is very small. In the case of R11 (=R12)>>R13, it is possible to obtain an equivalent circuit shown in FIG. 4C, in which the variable resistor R13 and the floating capacitance C11 are omitted. Since the floating capacitance C10 is connected in parallel with the current source I1, it can be ignored. Consequently, the time constant $\tau$ is measured as follows:

$$\tau = \frac{R14(R11 + R12)}{R11 + R12} \times C12 \tag{4}$$

Since $$\frac{R14(R11 + R12)}{R11 + R12}$$

substantially equals R14, the above equation (4) may be rewritten as follows:

$$\tau \approx R14 \times C12 \tag{5}$$

The above equation (5) proves that the time constant $\tau$ is not affected by any floating capacitance, since resistance R14 substantially remains at 0 $\Omega$. In the case of R11 (=R12)>>R13, I2/I1<<1 occurs, namely, the attenuation is great.

Figure 1:
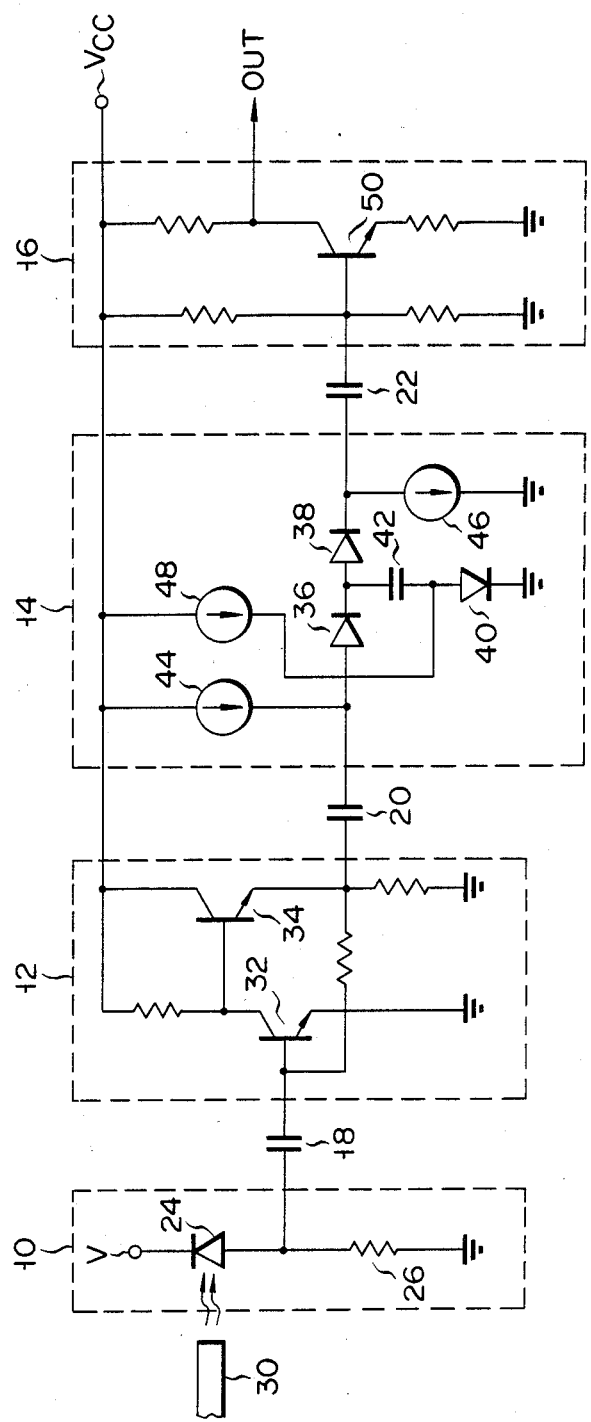
FIG. 1 shows the circuit arrangement of the conventional light-receiving device.
Figure 2A:
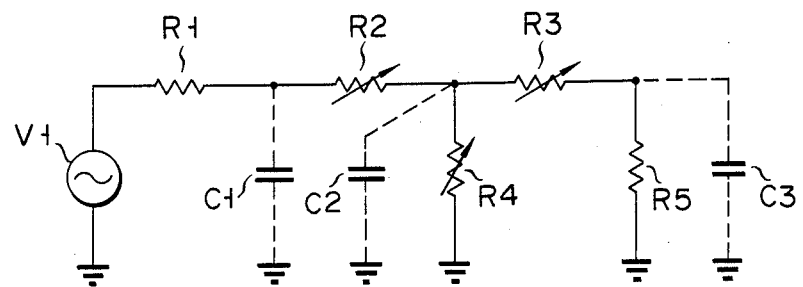
FIGS. 2A, 2B and 2C show the equivalent circuits of a variable attenuating circuit of FIG. 1.
Figure 2B:
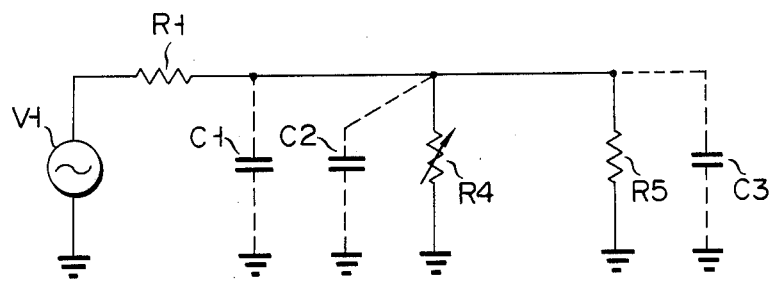
Figure 2C:
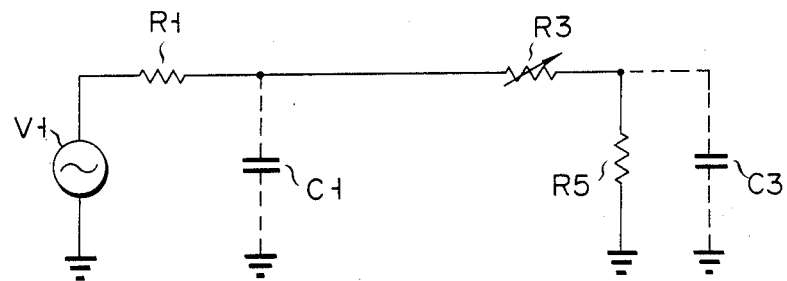

As seen from the prior equations (3) and (5), the floating capacitance has no effect on the time constant $\tau$, that is, the frequency response regardless of the attenuation level. Consequently it is possible to provide a light-receiving device wherein a floating capacitance does not reduce the cutoff frequency and a light signal of a high frequency can be converted into a voltage signal without deterioration of the waveform of the signal. This advantage occurs since a preamplifier is formed from a current amplifier and a variable attenuating circuit consists of a current attenuating circuit. With the light-receiving device of this invention, the preamplifier need not send forth a voltage signal formed from a current amplifier. Unlike the conventional preamplifier (shown in FIG. 1), the preamplifier of the present invention makes it possible to omit the transistor 34. Further, with the variable attenuating circuit in the present invention, the constant current source in the output side may be replaced by a resistor. As described above, this invention provide a light-receiving device with the aforementioned high performance and can be manufactured with fewer parts than required in the prior art due to the simple circuit arrangement.

It should be noted that this invention is not limited to the above-mentioned embodiment, but is applicable in various modifications without departing from the object and scope of the invention.

What is claimed is:

1. A light-receiving device which comprises:
    photo-detecting means which converts a received light signal to a current signal;
    a preamplifier for amplifying a current signal produced from said photo-detecting means;
    varible attenuating means, which includes a variable resistance means, for attenuating a current signal produced from said preamplifier in accordance with the resistance of said variable resistance means and for sending forth a current signal thus attenuated; and
    a main amplifier for amplifying said current signal produced from said variable attenuating means and issuing a signal thus amplified in the form of a voltage signal.

2. A light-receiving device according to claim 1, wherein said photo-detecting means includes a photo-detector and resistor connected in series between first and second power sources.

3. A light-receiving device according to claim 1, wherein said variable resistance means in said variable attenuating means comprises at least one PIN diode.

4. A light-receiving device according to claim 1, wherein said variable attenuating means comprises first and second PIN diodes connected in series, a third PIN diode connected to the node of said first and second PIN diodes through a capacitor, a first constant current source connected to said first PIN diode, a second constant current source connected to said third PIN diode, and a resistor connected to said second PIN diode.

* * * * *